US010989383B2

(12) United States Patent
Deng et al.

(10) Patent No.: US 10,989,383 B2
(45) Date of Patent: Apr. 27, 2021

(54) LIGHTING DEVICE AND SYSTEM FOR MOTOR VEHICLE USING A SURFACE LIGHT SOURCE

(71) Applicant: VALEO VISION, Bobigny (FR)

(72) Inventors: Xinyu Deng, Bobigny (FR); Lingxuan Zhu, Bobigny (FR)

(73) Assignee: VALEO VISION, Bobigny (FR)

( * ) Notice: Subject to any disclaimer, the term of this patent is extended or adjusted under 35 U.S.C. 154(b) by 113 days.

(21) Appl. No.: 16/020,219

(22) Filed: Jun. 27, 2018

(65) Prior Publication Data

US 2018/0372292 A1 Dec. 27, 2018

(30) Foreign Application Priority Data

Jun. 27, 2017 (FR) ................................ FR17 55882

(51) Int. Cl.
*F21V 19/00* (2006.01)
*F21S 41/155* (2018.01)
(Continued)

(52) U.S. Cl.
CPC .......... *F21S 41/155* (2018.01); *F21S 41/192* (2018.01); *F21S 43/145* (2018.01); *F21S 43/19* (2018.01); *F21V 17/104* (2013.01); *F21V 19/0015* (2013.01); *F21V 19/0045* (2013.01); *F21Y 2115/15* (2016.08); *H01L 2251/5361* (2013.01)

(58) Field of Classification Search
CPC .. F21V 19/0045; F21V 19/014; F21S 41/155; F21S 43/145; F21S 43/19
See application file for complete search history.

(56) References Cited

U.S. PATENT DOCUMENTS 5,924,790 A 7/1999 Ponton et al.
6,120,170 A 9/2000 Hamelbeck
(Continued)

FOREIGN PATENT DOCUMENTS

CN 102315363 A 1/2012
DE 10 2012 103 439 A1 10/2012
(Continued)

OTHER PUBLICATIONS

French Preliminary Search Report dated Feb. 20, 2018 in French Application 17 55882 filed on Jun. 27, 2017 (with English Translation of Categories of Cited Documents).
(Continued)

*Primary Examiner* — Sean P Gramling
(74) *Attorney, Agent, or Firm* — Oblon, McClelland, Maier & Neustadt, L.L.P.

(57) ABSTRACT

A lighting device including at least one surface light source and a support for this, wherein the surface light source includes a fixing element which has a T-shaped cross-section, and wherein the support includes a receiving part for the fixing element, a cross-section through the receiving part having a shape complementary to the cross-section of the fixing element. In the lighting device according to the invention, the fixing element includes an upright and a head, the upright extending from a lower face of the surface light source, the upright and the head together with this lower face delimiting at least one engagement groove for the receiving part of the support. Application to motor vehicles.

19 Claims, 5 Drawing Sheets

Figure 1:
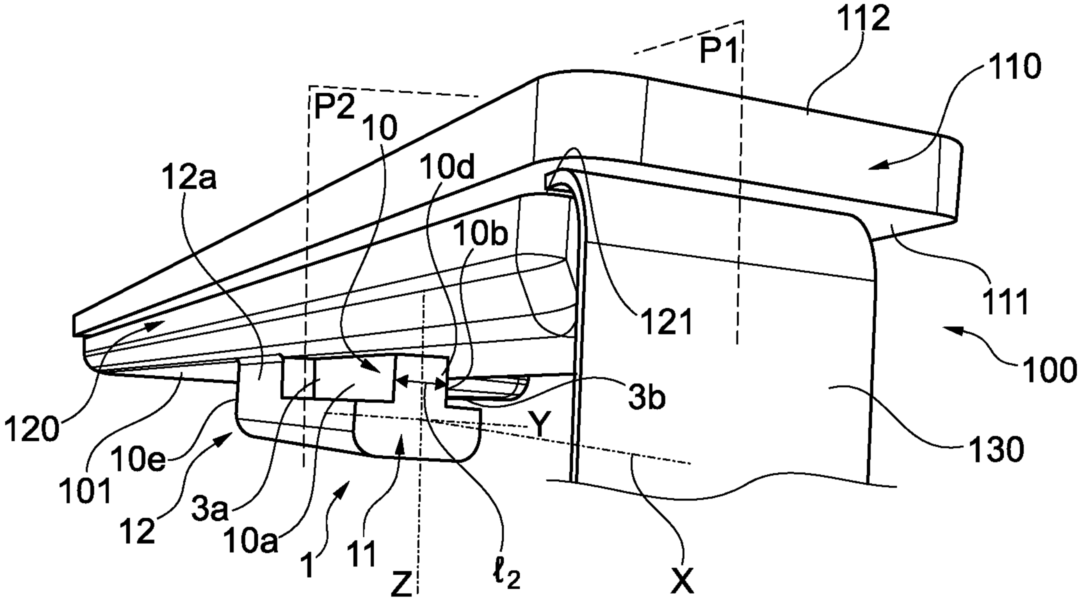

(51) Int. Cl.

| | |
|---|---|
| ***F21S 43/19*** | (2018.01) |
| ***F21V 17/10*** | (2006.01) |
| ***F21S 43/145*** | (2018.01) |
| ***F21S 41/19*** | (2018.01) |
| *F21Y 115/15* | (2016.01) |

(56) References Cited

U.S. PATENT DOCUMENTS

| | | | | |
|---|---|---|---|---|
| 2006/0109661 | A1 | 5/2006 | Coushaine et al. | |
| 2008/0130307 | A1 | 6/2008 | Reeves et al. | |
| 2012/0002427 | A1* | 1/2012 | Moon | F21K 9/00 362/382 |
| 2014/0111094 | A1 | 4/2014 | Kodama et al. | |
| 2014/0218949 | A1* | 8/2014 | Chiang | F21S 43/14 362/487 |
| 2016/0215963 | A1 | 7/2016 | Dubose et al. | |

FOREIGN PATENT DOCUMENTS

| | | | |
|---|---|---|---|
| EP | 0 860 321 | A2 | 8/1998 |
| EP | 1 659 337 | A1 | 5/2006 |
| EP | 2 719 946 | A1 | 4/2014 |
| EP | 2 886 936 | A1 | 6/2015 |
| KR | 10-2004-0085401 | | 10/2004 |
| KR | 10-2012-0062959 | | 6/2012 |
| WO | WO 2015/032949 | A1 | 3/2015 |

OTHER PUBLICATIONS

Combined Chinese Office Action and Search Report dated Jul. 30, 2020 in corresponding Chinese Patent Application No. 201810711871.2 (with English Translation and English Translation of Category of Cited Documents), 13 pages.

* cited by examiner

LIGHTING DEVICE AND SYSTEM FOR MOTOR VEHICLE USING A SURFACE LIGHT SOURCE

The field of the present invention is that of lighting and/or signalling devices for motor vehicles, and the present invention relates more particularly to lighting and/or signalling devices which use at least one surface light source.

The aesthetic and regulatory developments, and the changes in constraints of weight and size of elements used in a motor vehicle, mean that there is growing interest in producing lighting and/or signalling devices which combine extended aesthetic possibilities with illumination power, a long service life, compactness, flexibility and ease of implementation. In this sense, the use of light sources comprising one or more surface light sources, and in particular one or more organic light-emitting diodes, is a research and development path which opens up great possibilities in terms of optical performance and design flexibility.

An organic light-emitting diode or OLED conventionally comprises a lighting module formed from two electrodes, between which is placed an assembly of organic layers which emit light under the effect of a voltage applied across the two electrodes. The assembly formed by the electrodes and the organic layers is generally sandwiched between two substrates of a translucent material. On a practical level, an OLED source for a lighting and/or signalling system for a motor vehicle is conventionally composed of an emitter part, formed by the organic layers, the electrodes and above-mentioned substrates, and a base on which the emitter part is mounted by means of an appropriate adhesive, the assembly being connected to an electrical power supply and control device by suitable connection means.

Surface light sources, and in particular OLED sources, are increasingly used in the motor vehicle sector, both for lighting or signalling of the vehicle itself and for aesthetic reasons, in particular for aspects of the visual and light signature of the vehicle. In this context, the present invention is used preferably but not exclusively for the lamps intended for the rear signalling of motor vehicles.

In the known fashion, such a lamp comprises a housing closed by a lens, the housing and the closing lens together delimiting a volume receiving one or more light sources. Such a light also comprises a light source support which separates the receiving volume into an optical volume, which is visible from the outside of the vehicle and contains the emitter parts of the light sources, and a technical volume, which contains the elements connecting the light sources to an electrical power supply and control device of the sources. Such a support is conventionally produced by injection-moulding of a material selected for its mechanical and thermal properties. In the case of a lamp using surface light sources, these must be fixed to the support.

The technical problem to which the present invention proposes a solution is that of fixing the surface light sources to such a support. In fact, the current fixing mode used imposes specific forms for the support, production of which by injection-moulding is complex and costly, in particular since this fixing mode requires the use of moulds with compartments. Also, these compartments leave moulding marks on the support, which moulding marks may cause defects in the visual quality. The known fixing method creates, amongst others, design constraints on the surface light sources, limiting the aesthetic possibilities and preventing the achievement of all advantages of the technology of these surface light sources. Finally, with the fixing method currently used, the surface light sources are received between two substantially parallel fins which protrude from the surface of the support; it is evident that, on installation of the surface light sources, any movements thereof relative to the support are limited solely by these fins, i.e. in a single spatial direction. Also, it is not reliably ensured that the surface light sources are inserted as far as the stop. As a result, there may be slight discrepancies and/or an absence of reproducibility in the installation of the surface light sources. When these emit light, this may generate visual discontinuities which are a source of quality rejection.

The aim of the present invention is to remedy these drawbacks by proposing a simple and reproducible fixing method, implementation of which is compatible with simple and low-cost production of the support which is intended to carry the surface light sources in a lighting and/or signalling lamp, for example a rear lamp, of a motor vehicle.

To this end, the object of the invention is a lighting device comprising at least one surface light source and a support for this, wherein the surface light source comprises a fixing element which extends in a longitudinal direction and has a T-shaped cross-section, and wherein the support comprises a receiving part for the fixing element, a cross-section through the receiving part having a shape complementary to the cross-section of the fixing element, the lighting device comprising at least one stop of the fixing element against the receiving part, the stop being arranged in the extension of the fixing element in the longitudinal direction.

The support for the lighting device is for example a mask intended to conceal a technical volume of a rear lamp of a motor vehicle.

The term "surface light source" means a source with a light-emitting surface, in which the dimensions of the light-emitting surface are substantially greater than the height of the surface source, for example the area of which is greater than or equal to 1 $cm^2$, or greater than 10 $cm^2$.

Advantageously, the surface light source comprises an emitter part which takes the general form of a plate, one face of which emits light. In arbitrary fashion, the term "upper" is used below to describe the emitter face of the surface light source.

Advantageously, the fixing element extends from a base attached via a suitable adhesive to a face of the emitter part of the surface light source opposite said upper face.

According to a characteristic of the invention, the fixing element comprises an upright capped with a head, the upright extending from a lower face of the surface light source, the upright and the head together with this lower face delimiting at least one engagement groove for the receiving part of the support.

Advantageously, the head terminates the fixing element since no material is provided which extends from the head in a direction opposite this, oriented towards the surface light source. In other words, there is no additional upright which emerges from the head, other than the upright constituting the fixing element.

It is understood here that the term "lower face" of the surface light source means the lower face of the base as defined above, i.e. the face of the base opposite the face via which the latter is attached to the emitter part of the surface light source.

The upright of the fixing element advantageously takes the form of a bar which extends from the lower face of the surface light source in a first direction called the height of the fixing element, substantially perpendicularly to this lower face. This upright also extends along the lower face of the surface light source in a second direction or main extension direction, also referred to below as the longitudinal direction of the surface light source. The dimension of the upright of the fixing element in this longitudinal direction is referred to below as the length of the fixing element.

In an advantageous but not exclusive variant embodiment, the upright of the fixing element substantially takes the form of a rectangular parallelepiped: its cross-section, in a cross-section plane perpendicular to said longitudinal direction, generally has the form of a rectangle.

The head of the fixing element extends substantially parallel to the lower face of the surface light source from a lower edge of the upright of the fixing element, opposite the edge via which this upright is attached to the lower face of the surface light source. Advantageously, the head of the fixing element extends substantially over the entire length of the fixing element in the previously defined longitudinal direction.

Advantageously, the head of the fixing element extends substantially symmetrically on either side of the upright of the fixing element, in a transverse direction perpendicular to said longitudinal direction and to the previously defined height. The dimension of the head of the fixing element in this transverse direction is defined as the width of this head. It is noted that a ratio between the width of the head and a width of the upright measured along a same line is greater than at least three. The head is significantly wider than the upright so as to form usable grooves.

As a result, the cross-section of the assembly formed by the upright and the head of the fixing element, in a cross-section plane perpendicular to said longitudinal direction, is generally T-shaped, the vertical branch of which is formed by the cross-section of the upright of the fixing element and the horizontal branch of which is formed by the cross-section of the head of the fixing element.

As a result of this particular configuration of the upright and the head of the fixing element, an engagement groove is formed by the lower face of the surface light source together with the vertical branch of said T-shape as implemented by the upright of the fixing element, and with each part of the horizontal branch of this T-shape implemented by the two parts of the head of the fixing element which extend transversely on either side of the upright thereof. The fixing element, together with the lower face of the surface light source, thus forms two engagement grooves situated on either side of the upright of the fixing element in the previously defined transverse direction.

According to another characteristic of the invention, the stop comprises at least one blocking wall, and advantageously two blocking walls, which extends or extend substantially perpendicularly to the longitudinal direction of the fixing element, in particular in a plane substantially perpendicular to the previously defined longitudinal direction. This blocking wall extends from the lower face of the surface light source to an end of the upright of the fixing element in the longitudinal direction. Advantageously, the dimension of the blocking wall in said transverse direction is at least equal to the dimension of the head of the fixing element in the same transverse direction. The blocking wall, at the end of the upright of the fixing element to which is attached, thus forms a closure of the previously defined engagement grooves.

The upright, head and blocking wall form the fixing element of the surface light source, configured to cooperate by engagement with the receiving part of the support of the surface light source.

The receiving part of the support of the lighting device according to the invention has one or more of the following characteristics, taken separately or in combination:

- the receiving part comprises a guide portion for the fixing element and an engagement portion for the fixing element, situated in the extension of each other in the main extension direction of the receiving part. It is understood here that the guide portion and the engagement portion are situated side by side, at the end of each other in the longitudinal direction, and at their intersection share a common end,
- the engagement portion extends protruding from the guide portion in a direction perpendicular to a plane containing the guide portion. Advantageously, the guide portion also extends protruding in the same elevation direction from a support surface on which the receiving part is arranged. In other words, the receiving part as a whole forms a protrusion from the mask,
- the engagement portion is formed from two side walls, an upper wall which extends between the side walls, an inlet wall and optionally an end wall, which together delimit a receiving cavity for the fixing element of the surface light source. The side walls of the engagement portion are substantially parallel to each other and perpendicular to the upper wall. The inlet wall and the end wall are both perpendicular to the upper wall and to the side walls of the engagement portion and extend between these. Advantageously, the side walls of the engagement portion extend from the surface of the support on which the receiving part is arranged,
- the inlet wall of the engagement portion is arranged at the intersection of the guide portion and the engagement portion in the main extension direction of the receiving part,
- the inlet wall comprises an opening forming an inlet to said receiving cavity. In other words, the shapes and dimensions of the opening are defined to allow engagement of the fixing element of the surface light source within the receiving cavity through this opening,
- a slot is arranged in the upper wall of the engagement portion. The largest dimension of the slot is oriented in the main extension direction of the receiving part. More precisely, this slot extends in a substantially central position of the upper wall of the engagement portion, in a transverse direction substantially perpendicular to the main extension direction and to an elevation direction of the receiving part,
- a width of the slot, measured perpendicular to the main extension direction of the receiving part, is greater near the guide portion than near an end edge longitudinally delimiting the slot. This facilitates the insertion of the fixing element in the receiving part. The width of the slot may develop linearly, retaining the mutually parallel side walls or by inclining these. The side walls may therefore be inclined relative to each other such that the width of the slot, measured perpendicularly to the main extension direction of the receiving part, is greater close to the guide portion then close to an end edge which terminates the slot,
- the inlet wall forms a zone of the receiving part against which the stop between the fixing element and the receiving part rests in order to limit an insertion movement of the fixing element in the receiving part,
- advantageously, the dimensions of this slot are complementary to the dimensions of the upright of the fixing element, and in particular to the height and width thereof as previously defined, such that the upright may easily be inserted in the slot and move therein, in particular in the longitudinal direction of the upright. In addition, the thickness of the upper wall is advantageously defined as less than the height of the upright of the fixing element, such that the side edges of the said slot may be engaged in the engagement grooves of the fixing element, at one of its ends in the main extension direction of the receiving part, the slot opens in the inlet wall of the engagement portion into an opening configured to allow passage of the upright of the fixing element. At its opposite end in the main extension direction, the slot is limited by a base which is substantially parallel to the inlet wall of the receiving cavity for the fixing element, the dimension of the slot, measured in the main extension direction of the engagement portion of the receiving part, between said opening and the base, is at least equal to the length of the upright of the fixing element, each side wall comprises, on its lower face oriented towards the receiving cavity for the fixing element, a guide shoulder for the head of the fixing element of the surface light source. Advantageously, each of these shoulders is arranged on the upper wall of the engagement portion, and its dimension in the main extension direction of the receiving part is substantially equal to the dimension of the previously defined slot in the same direction. More precisely, in the previously defined elevation direction, each shoulder is closer to the upper wall of the receiving cavity for the fixing element than to the surface of the support from which the receiving part emerges. Advantageously, the dimension between the two shoulders, measured perpendicularly to the main extension direction of the receiving part, is at least equal to the width of the head of the fixing element.

The surface light source is fixed to its support in the following manner:

the head of the fixing element is placed resting on the guide portion and is brought to slide along this until the end of the fixing element opposite the stop, called the front end, reaches the opening of the previously defined receiving cavity. Such an arrangement allows the T-shape of the fixing element to be aligned with the receiving part, the fixing element is engaged in the receiving cavity by longitudinal translation, i.e. in a movement parallel to the longitudinal direction of the fixing element. More precisely, the side edges of the slot arranged in the upper wall of the engagement portion are each received in an engagement groove of the fixing element. Each engagement groove thus forms a slide and guide rail in which a lateral edge of the slot engages. In this sliding movement, the upright of the fixing element slides along the previously defined slot, and the side walls of the head of the fixing element slide along each guide shoulder arranged in the side walls of the engagement portion. Each of these shoulders thus forms a complementary guide for the fixing element in its movement inside the receiving cavity, the fixing element slides along the previously defined slot until the blocking wall stops against the inlet wall of the engagement portion.

As a result of the above, when the surface light source is fixed on its support, the longitudinal direction of its fixing element and the main extension direction of the receiving part of the support are congruent. Similarly, the elevation direction of the receiving part and the height direction of the fixing element are congruent, and the same applies to the width of the fixing element and the transverse direction of the engagement portion.

Thus the previously defined height, width and length of the fixing element, when the surface light source is received in the receiving cavity, respectively become the height, width and length of the lighting device. It is however noted that these denominations in no way prejudice the final orientation of the lighting device according to the invention in a lighting and/or signalling lamp of a motor vehicle.

When the surface light source is assembled with its support to form the lighting device according to the invention, it is blocked in several spatial directions:

firstly, the stop of the fixing element against the receiving part, in particular when the blocking wall rests against the inlet wall and/or when the front end of the fixing element rests against the end edge of the slot, forms a blocking in one and the same way of the previously defined longitudinal direction, the side edges of the slot and the side walls of the engagement portion, in some cases the shoulders arranged thereon, form a blocking in both ways of the previously defined transverse direction, the T-shape of the fixing element and the engagement of the side edges of the slot in the engagement grooves, delimited by the fixing element and the lower face of the surface light source, cause a blocking in both ways of the elevation direction of the lighting device according to the invention.

Such blocking guarantees the reproducible assembly of the surface light source on its support, thus fulfilling one of the aims of the invention.

Also, the shapes of the receiving part arranged on the support of the surface light source allow this support to be produced by a simple injection-moulding operation, which in particular does not require the use of compartment moulds: the production method of such a support is therefore simplified and the cost reduced, thus fulfilling another of the aims of the invention.

In another aspect of the invention which further facilitates assembly of the surface light source on its support, the invention provides a pre-assembly hook for the surface light source on the support. Such a pre-assembly hook comprises a lug protruding from a side wall of the engagement portion and a flexible tab arranged on the fixing element. According to a variant embodiment, the pre-assembly hook extends inside the receiving cavity for the fixing element in the receiving part of the support. This pre-assembly hook comprises the lug which advantageously protrudes from one of the side walls of the engagement portion inside said receiving cavity.

The pre-assembly hook also comprises, arranged at the front end of the upright of the fixing element, the flexible tab configured to cooperate with said lug. As a reminder, the front end of the upright of the fixing element is the end of the upright which lies opposite, in the longitudinal direction of the fixing element, the end of said upright comprising the blocking wall. Advantageously, the flexible tab is configured such that, in the longitudinal sliding movement of the fixing element inside the receiving cavity, it deforms when it reaches said lug and then, once the longitudinal sliding movement has brought it past this lug, it comes to rest against this, preventing any reverse sliding movement. In other words, the pre-assembly hook formed by the lug and the flexible tab achieves a blocking of the surface light source in the receiving part in the longitudinal direction of the lighting device according to the invention, in the direction opposite the insertion direction of the surface light source with its support. This allows pre-assembly to be achieved, which prevents the surface light source(s) from undesirably leaving the support during handling of the latter.

Preferably, the surface light source has a light emission surface area greater than 1 $cm^2$, or greater than 10 $cm^2$. Preferably, the surface light source is an organic light-emitting diode.

The invention also extends to a lighting and/or signalling system for motor vehicle comprising at least one lighting device having one or more of the characteristics just described, taken separately or in combination.

Advantageously, such a lighting system comprises a plurality of lighting devices as just described, all fixed on a support common to the plurality of surface light sources. Advantageously, the surface light sources are arranged staggered on this support: such an arrangement in particular allows an increase in the luminous surface area created by the sources inside the lighting and/or signalling lamp.

According to this aspect of the invention, such a lighting and/or signalling system comprises a housing closed by a lens, the housing and the lens together delimiting a receiving volume which accommodates a plurality of lighting devices according to the invention, the support then forming a mask arranged in the receiving volume to divide this into a first sub-volume containing the lighting devices according to the invention, and a second sub-volume, called the technical volume or zone, containing the connection elements of each lighting device.

More particularly, the first sub-volume is visible from outside the vehicle, while the technical volume is not.

According to the invention, such a lighting and/or signalling system comprises a monobloc piece configured to block at least two surface light sources on the support, for example in a direction opposite the insertion direction of the surface light sources in the receiving part. This monobloc piece secures the mounting of the surface light sources on the support, once they are installed thereon by means of the fixing elements and the receiving parts previously described. The monobloc piece is thus common to several lighting devices according to the invention.

Figure 2:
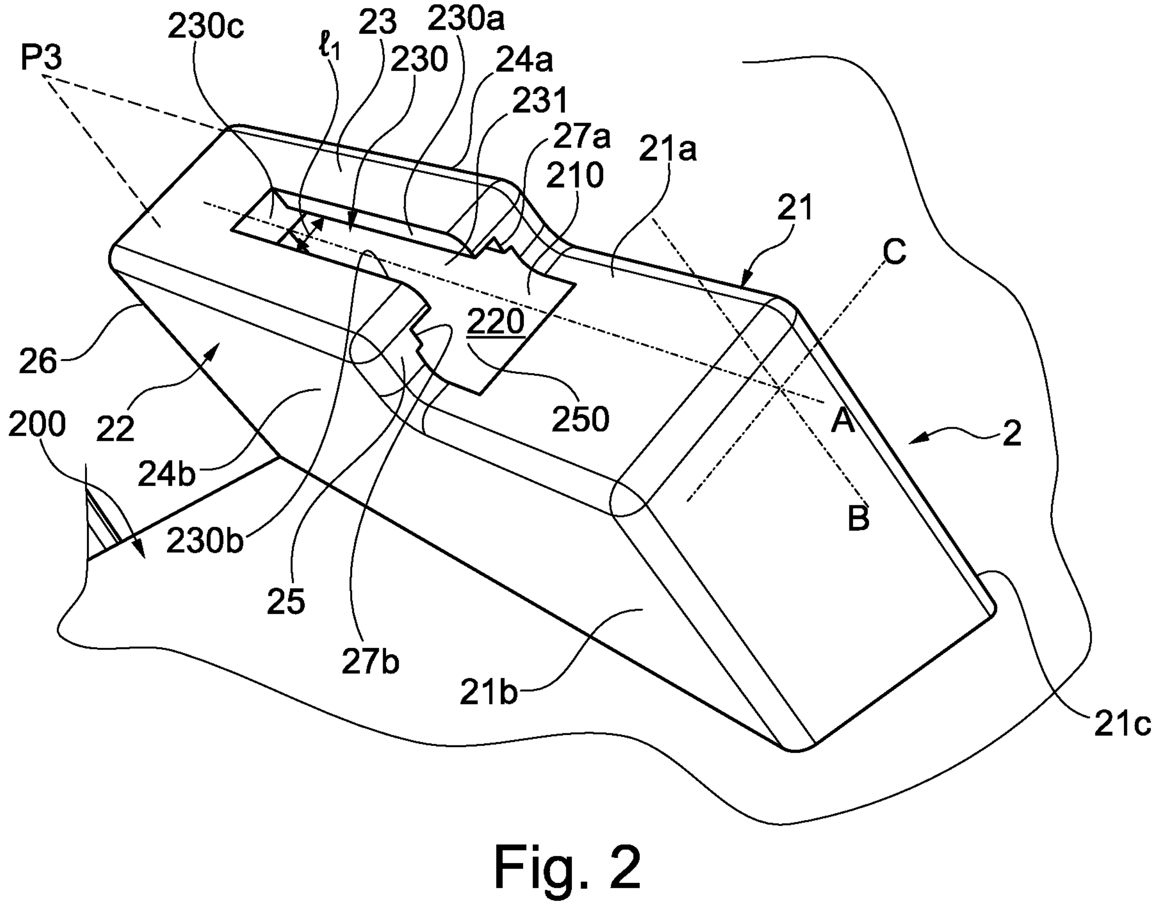
Figure 3:
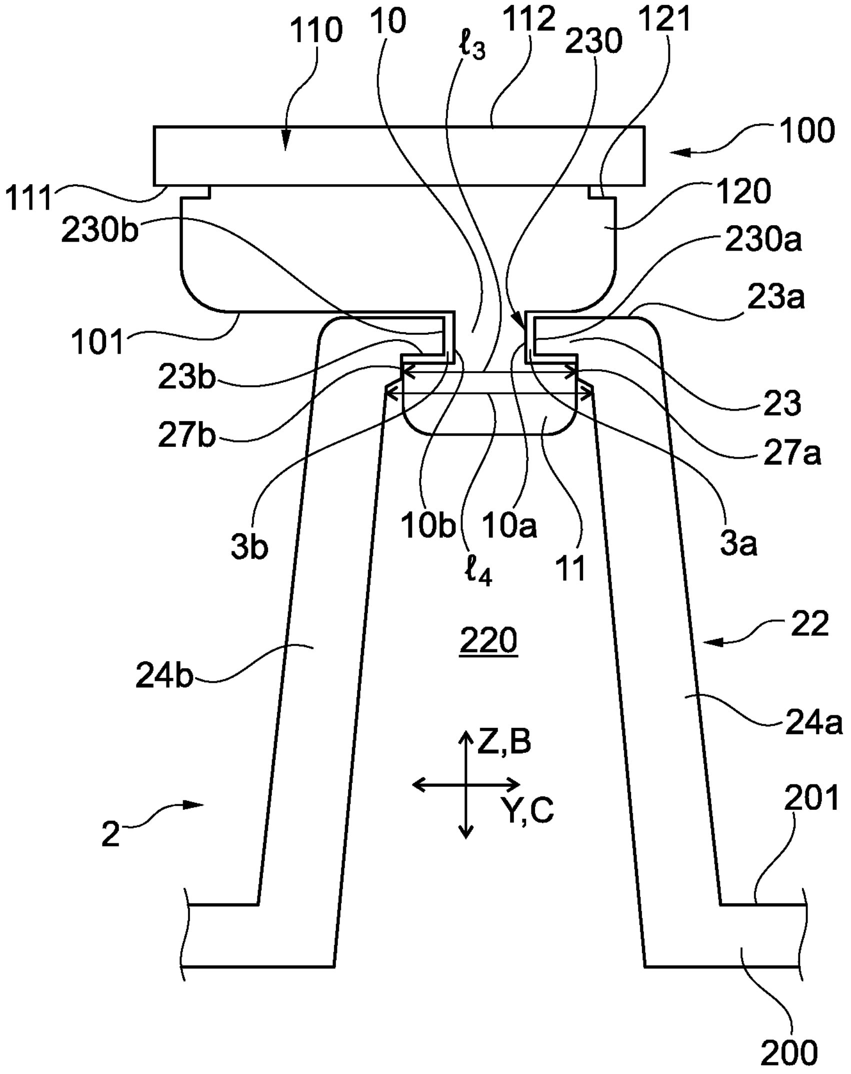
Figure 4:
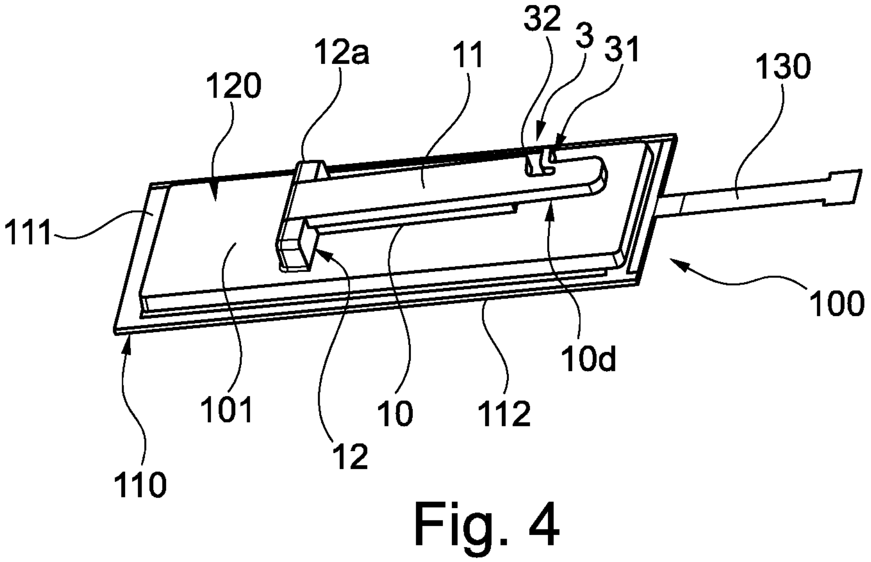
Figure 5:
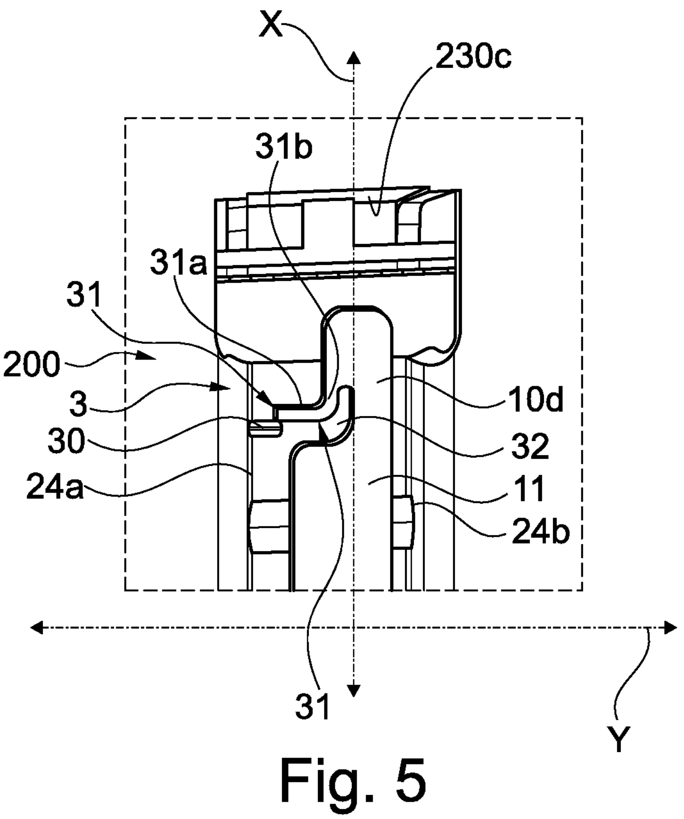
Figure 6:
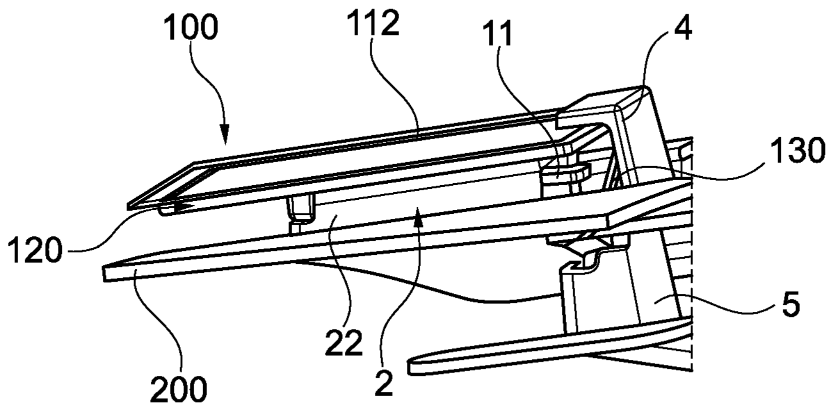
Figure 7:
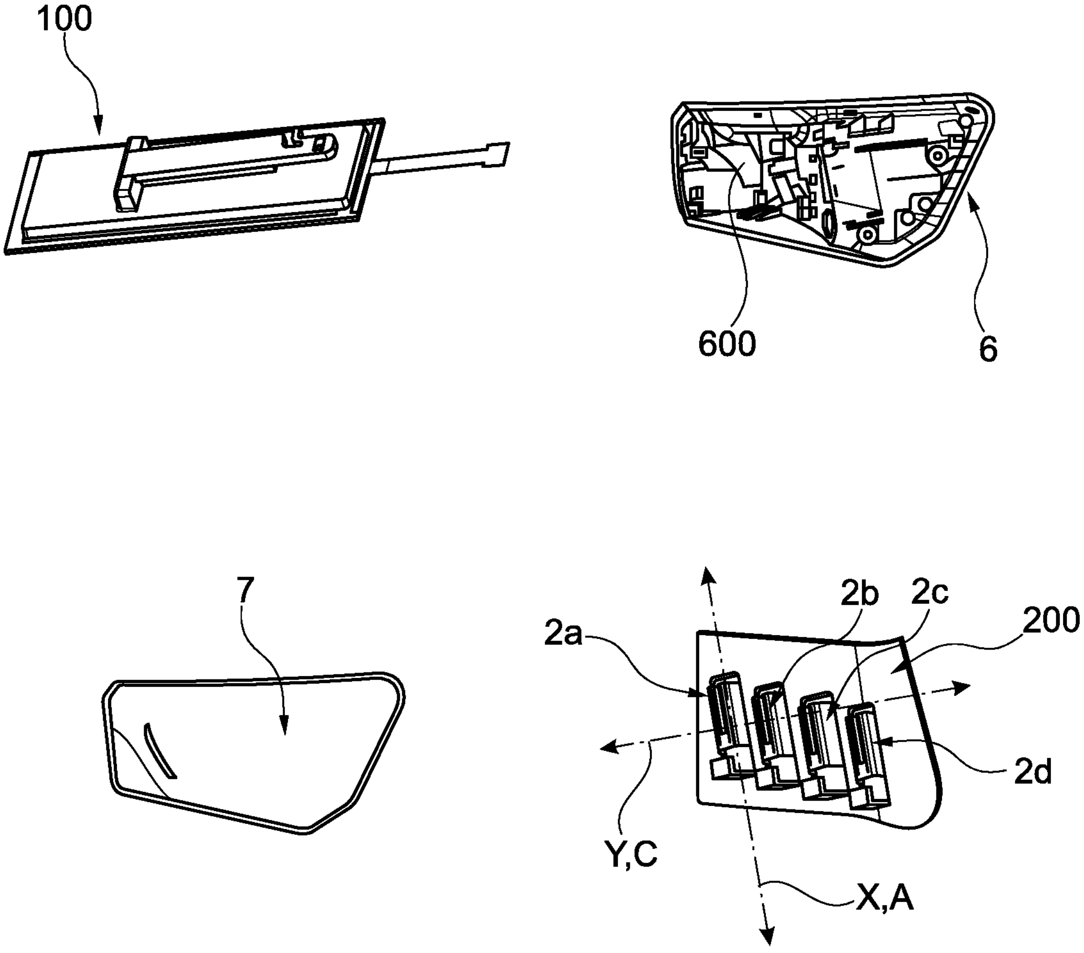
Figure 8:
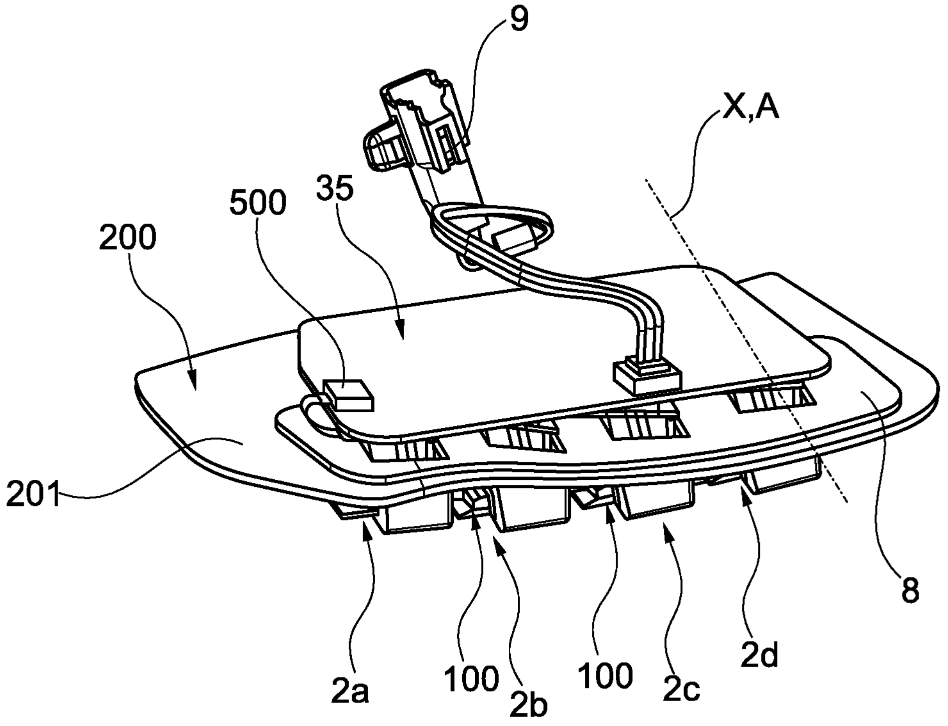

Further characteristics, details and advantages of the invention will arise more clearly from reading the description, given below for information, in relation to the attached drawings in which:

FIG. 1 is a perspective view of an organic light-emitting diode of a lighting device according to the invention, FIG. 2 is a perspective view of a receiving part of a support of the organic light-emitting diode of the lighting device according to the invention, FIG. 3 is a cross-sectional view of a lighting device according to the invention, FIG. 4 is a perspective view of a variant embodiment of an organic light-emitting diode of a lighting device according to the invention, FIG. 5 is a view from below of a detail of the lighting device according to the invention as shown on FIG. 4, FIG. 6 is a perspective view of a lighting device as illustrated by FIGS. 4 and 5 in which the organic light-emitting diode is assembled with its support, FIG. 7 is an exploded view of the various components of a lighting and/or signalling system according to the invention, and FIG. 8 is a rear view of a lighting and/or signalling system according to the invention.

It should first be noted that although the figures present the invention in detail for its implementation, these figures may naturally serve to better define the invention where applicable.

Also, to simplify reading, the organic light-emitting diodes are designated below under the name OLED diodes.

With reference to the various figures, and as described above, a lighting device according to the invention comprises at least one OLED diode 100 and a support 200 for fixing this. The OLED diode 100 and the support 200 are mechanically connected by a fixing element 1 arranged on the OLED diode 100, and by a receiving part 2 for the fixing element 1 arranged on the support 200.

With reference in particular to FIG. 1, an OLED diode 100 of a lighting device according to the invention is formed by a part 110 emitting light rays, which is attached to a base 120 advantageously produced by injection of synthetic material into a mould. The OLED diode 100 also comprises a connecting element 130 for its electrical connection to a supply assembly, not shown on FIG. 1. The connecting element 130 is for example a flexible printed circuit board or connection wires.

The emitter part 110 of the OLED diode 100, formed from the assembly of organic layers, electrodes and substrates, according to the embodiment shown in FIG. 1, has the general form of a flat plate, a lower face 111 of which is coupled to an upper face 121 of the base 120. The lower face 111 of the emitter part 110 is here defined as being the face opposite the emitter face 112 of the OLED diode 100, from which the light rays generated by the OLED diode 100 emerge, also referred to in the description below as the upper face 112 of the OLED diode 100.

As FIG. 1 shows, the fixing element 1 of the OLED diode 100 comprises an upright 10 which extends from the lower face 101 of the base 120. The lower face 101 of the base 120 is here defined as being the face of this base opposite the upper face 121 via which it is coupled to the emitter part 110 of the OLED diode 100. By extension, the lower face 101 of the base 120 is designated below as the lower face of the OLED diode 100. Advantageously, the upright 10 of the fixing element 1 extends opposite the upper face 112 of the OLED diode 100, in the Z direction or height substantially perpendicular to the lower face 101 of the OLED diode 100. Along the lower face 101 of the OLED diode 100, the upright 10 of the fixing element 1 extends in a main extension direction X, called the longitudinal direction in the description which follows. The dimensions in this longitudinal direction are designated below as lengths.

According to the variant embodiment illustrated more particularly by the figures, the upright 10 of the fixing element 1 takes the general form of a rectangular parallelepiped comprising two side faces, respectively 10*a*, 10*b*, substantially parallel to each other and perpendicular to the lower face 101 of the OLED diode 100. More precisely, the side faces 10*a*, 10*b* of the upright 10 extend in a plane substantially parallel to the height Z and to the longitudinal direction X defined above. As has just been defined, the upright 10 of the fixing element 1 in particular has a longitudinal plane of symmetry P1 defined by said longitudinal direction X and parallel to the side faces 10*a*, 10*b*, the longitudinal plane of symmetry P1 being a central longitudinal plane of the upright 10 in the transverse direction Y or width, perpendicular to the longitudinal direction X and the height Z defined above. The upright 10 also comprises, in the longitudinal direction X, an end wall 10*d* called the front end, and an end wall 10*e* called the rear end. The front end 10*d* and the rear end 10*e* are substantially perpendicular to the side walls 10*a*, 10*b*. With reference to FIG. 1, the front end 10*d* is the end of the upright 10 which is closest to the connecting element 130 of the OLED diode 100, the rear end 10*e* being the end of the upright 10 which is furthest away from this connecting element 130. By extension, the front end 10$d$ and the rear end 10$e$ of the upright 10 are designated below as the front end and the rear end respectively of the fixing element 1, and the terms "front" and "rear" are applied with reference to the longitudinal direction X.

The fixing element 1 also comprises a head 11 which extends substantially parallel to the lower face 101 of the OLED diode 100 on either side of the upright 10 in the width Y. It is noted that the fixing element 1 is advantageously formed as a single piece from the same material as the base 120. According to the embodiment illustrated more particularly on the figures, the head 11 has the form of a substantially parallelepipedic plate arranged symmetrically relative to the longitudinal plane P1.

The result of the respective configuration of the upright 10 and head 11 is that these two elements, in cross-section along a cross-section plane P2 perpendicular to the previously defined longitudinal direction X, form an inverted T-shape, the vertical branch of which is formed by the upright 10 and the horizontal branch of which is formed by the head 11. This inverted T extends below the base 120 of the OLED diode 100, substantially perpendicularly to the lower face 101 thereof. The term "below" here means that this inverted T-shape extends opposite the emitter part 110 of the OLED diode 100, relative to the base 120 and in the height Z previously defined. This inverted T-shape is visible more particularly on FIG. 3 which shows a cross-section of the lighting device according to the invention in said cross-section plane P2. In other words, the head 11 on each side of the upright 10, together with each side face 10$a$, 10$b$ of the latter and the lower face 101 of the OLED diode 100, delimits an engagement groove respectively referenced 3$a$, 3$b$ which extends in the longitudinal direction X.

As FIG. 1 shows, the lighting device comprises a stop 12 of the fixing element 1 against the receiving part 2. Such a stop 12 limits the relative movement between this fixing element 1 and the receiving part 2 in the longitudinal direction X of the fixing element 1. The stop 12 is made at the end of the fixing element 1, more particularly at the end of the T-shaped part of this fixing element 1. This stop 12 longitudinally closes at least one of the grooves 3$a$, 3$b$.

In one embodiment, the stop 12 comprises at least one blocking wall 12$a$ which extends from the lower face 101 of the OLED diode 100, substantially perpendicularly to the upright 10 and the head 11. The blocking wall 12$a$ thus extends in a plane substantially parallel to both the previously defined height Z and the width Y. More precisely, the blocking wall 12$a$ extends to the rear end 10$e$ of the upright 10 which is furthest away from the electrical connecting element 130 of the OLED diode 100. Advantageously, the blocking wall 12$a$ forms a closure of the engagement grooves 3$a$, 3$b$ at the end 10$e$ of the upright 10. As an example, the width of the blocking wall 12$a$ is at least equal to the width of the head 11.

With reference to FIG. 2, the receiving part 2 of the support 200 of the lighting device according to the invention comprises a first portion 21 called the guide portion, and a second portion 22 called the engagement portion.

According to the embodiment illustrated more particularly in this figure, the guide portion 21 extends protruding from a surface of the support 200 from which the receiving part 2 emerges, in a direction B of the receiving part 2 called the elevation direction. The guide portion 21 is formed by a substantially flat upper wall 21$a$ and two side walls 21$b$, 21$c$ which are substantially parallel to each other and perpendicular to the upper wall 21$a$. The side walls 21$b$, 21$c$ of the guide portion 21 in particular extend substantially parallel to the elevation direction B. The upper wall 21$a$ of the guide portion extends between the edges of the side walls 21$b$, 21$c$ opposite the edges by which the side walls are attached to the surface of the support 200.

The invention provides that the engagement portion 22 extends from the guide portion 21 protruding in said elevation direction B. The invention also provides that the guide portion 21 and the engagement portion 22 extend in the extension of each other in a main extension direction A of the receiving part 2, perpendicular to said elevation direction B. More precisely, the engagement portion 22 extends side by side with the guide portion 21 in the main extension direction A of the receiving part 2, from one end of the guide portion 21. It is understood here that the term "side by side" means that the engagement portion 22 is attached at one of its ends in said main extension direction A to one end of the guide portion 21 in this main extension direction A. According to the embodiment variant illustrated more particularly in FIG. 2, the guide portion 21 and the engagement portion 22 each have the general form of a substantially parallelepipedic block, the longest side of which extends in the main extension direction A. This variant embodiment, which is not exclusive, is particularly advantageous with regard to production of the support 200, in that the production of substantially parallelepipedic forms of the receiving part 2 by injection of a synthetic material into a mould, does not require the use of compartments in this mould. This allows a reduction in the costs of production of the support 200.

The engagement portion 22 is formed by an upper wall 23 and two side walls 24$a$, 24$b$ which are substantially parallel to each other and perpendicular to the upper wall 23 of the engagement portion 22. It also comprises an inlet wall 25 at its end via which it is attached to the guide portion 21 and, at its opposite end in the main extension direction A, an end wall 26 substantially parallel to the inlet wall 25. The inlet wall 25, upper wall 23, side walls 24$a$, 24$b$ and optionally the end wall 26 of the engagement portion 22 together delimit a receiving cavity 220 for the fixing element 1 of the OLED diode 100.

According to the invention, the receiving cavity 220 for the fixing element 1 opens in the inlet wall 25 of the engagement portion 22 into an opening 250. According to the embodiment variant illustrated more particularly in FIG. 2, the opening 250 is extended on the upper wall 21$a$ of the guide portion 21 into a presentation orifice 210, the purpose of which will be specified below.

It is noted that according to the variant embodiment illustrated more particularly by the figures, the side walls 21$c$ and 21$a$ respectively of the guide portion 21 and the engagement portion 22 form a single and same wall, in the same way as the side walls 21$b$ and 24$b$ respectively of the guide portion 21 and the engagement portion 22. In other words, the dimension between the side walls 21$c$, 21$b$ of the guide portion 21, measured perpendicularly to the main extension direction A of the receiving part 2, is substantially equal to the dimension between the side walls 24$a$, 24$b$ of the engagement portion 22, measured perpendicularly to said main extension direction A.

The upper wall 23 of the engagement portion 22 comprises a slot 230 which extends in the main extension direction A of the receiving part 2. The slot 230 is limited by two side edges 230$a$, 230$b$ substantially parallel to each other and to the main extension direction A. The slot 230 opens in the inlet wall 25 into an engagement opening 231. Advantageously, the slot 230 is centred on the upper wall 23 of the engagement portion 22, i.e. it extends symmetrically on either side of the plane of symmetry P3 defined by the main extension direction A of the receiving part 2 and by the elevation direction B defined above. The plane of symmetry P3 is a central longitudinal plane of the upper wall 23 in a transverse direction C perpendicular to the elevation direction B and to the main extension direction A.

At its end opposite the engagement opening 231 in the main extension direction A of the receiving part 2, the slot 230 is closed by an end edge 230*c* substantially perpendicular to the side edges 230*a*, 230*b* delimiting the slot 230. In other words, the slot 230 forms a substantially rectangular incision in the upper wall 23 of the engagement portion 22, the long side of which is oriented in the previously defined main extension direction A.

It is noted that a width 11 between the side edges 230*a*, 230*b* of the slot 230, measured perpendicularly to the main extension direction A, is slightly greater than the width 12 of the upright 10 of the fixing element 1 measured in the same direction. Also, a length of the slot 230 in the main extension direction A is substantially equal to a length of the upright 10 of the fixing element 1. It is understood here that these dimensions are defined such that the upright 10 of the fixing element 1 may be fully inserted easily but without excessive play in the slot 230.

As FIG. 3 shows, each side wall 24*a*, 24*b* of the engagement portion 22, on its inner face situated on the side of the inner volume of the receiving cavity 220, comprises at least one shoulder, or two shoulders referenced 27*a*, 27*b*, which extends or extend substantially between the inlet wall and the end wall which longitudinally delimit the receiving cavity 220. As FIG. 3 shows more precisely, the shoulders 27*a*, 27*b* are advantageously arranged from the inner face 23*b* of the upper wall 23 situated inside the receiving cavity 220. Each shoulder 27*a*, 27*b* forms a constriction of the inner volume of the receiving cavity 220. More precisely, a width 13 between the shoulders 27*a* and 27*b*, measured perpendicularly to the main extension direction A, is slightly less than a width 13 between the inner faces of the side walls 24*a*, 24*b* of the engagement portion 22, measured in the same direction.

The width 13 measured between the shoulders 27*a* and 27*b* is greater than the width of the head 11 measured in the width Y of the fixing element 1. It must be understood here that this dimension is defined such that the head 11 of the fixing element 1 may be inserted between the shoulders 27*a*, 27*b* easily but without excessive play, in particular in the width direction of said head 11.

The result of the above is that, in a cross-sectional plane substantially perpendicular to the main extension direction A, the slot 230 and receiving cavity 220 have a shape substantially complementary to the inverted T-shape of the assembly formed by the upright 10 and the head 11 of the fixing element 1.

With reference to FIG. 3, the process of assembly of the OLED diode 100 with its support 200 is as follows.

In a first assembly step, the fixing element 1 of the OLED diode 100 is engaged in the previously defined receiving cavity 220. To facilitate this guidance, the fixing element 1 may be brought to rest by its head 11 against the upper wall 21*a* of the guide portion 21. The front end 10*d* of the upright 10 of the fixing element 1 is thus engaged in the opening 250 of the inlet wall 25. As a result of the respective configurations and dimensions of the slot 230 and fixing element 1, the upright 10 then engages in the engagement opening 231 via which the slot 230 opens in the inlet wall 25. In this operation, the upper wall 21*a* of the guide portion 21 and the presentation orifice 210 arranged therein play a guiding role and facilitate the engagement of the fixing element 1 in the receiving cavity 220.

The fixing element 1 and the OLED diode 100 which carries it are then slid in the main extension direction A of the receiving part 2, in the direction of the end wall 26 of the receiving cavity 220 and of the end edge 230*c* of the slot 230. In this longitudinal sliding movement, because of the respective dimensions of the slot 230 and the upright 10 of the fixing element 1, the side edges 230*a*, 230*b* of the slot 230 each engage in an engagement groove 3*a*, 3*b* of the fixing element 1. In other words, each engagement groove 3*a*, 3*b* forms a rail in which part of the upper wall 23 of the engagement portion 22 engages. It is noted that the lower face 101 of the OLED diode 100 is then substantially resting against the outer face 23*a* of the upper wall 23 of the engagement portion 22, the outer face 23*a* being the face of the upper wall situated outside the receiving cavity 220.

In said sliding movement, the side walls of the head 11 of the fixing element 1 are guided by the shoulders 27*a*, 27*b* arranged in the receiving cavity 220. The OLED diode 100 is therefore guided, by cooperation of its fixing element 1 with the slot 230 and advantageously the shoulders 27*a*, 27*b* respectively, in its sliding in the receiving part 2.

This sliding movement in the main extension direction A continues until the front end 10*d* of the upright 10 of the fixing element 1 meets the end edge 230*c* of the slot 230. Advantageously, the dimensions and in particular the width of the stop 12, and the dimension of the opening 250 in the previously defined transverse direction C, are defined such that the stop 12 substantially fully closes this opening 230, thus closing the receiving cavity 220. Such an arrangement limits any leakage of light between the technical part and the visible part of the lighting system according to the invention.

When the sliding movement of the fixing element 1 along the slot 230 is terminated, i.e. when the front end 10*d* of the upright 10 of the fixing element 1 comes to stop against the end edge 230*c* of the slot 230, the OLED diode 100 is assembled with the support 200 via the receiving part 2, thus forming the lighting device according to the invention. In this position, the longitudinal direction X of the fixing element 1 and the main extension direction A of the receiving part 2 are congruent or substantially congruent. Similarly, the direction in which the receiving part 2 extends protruding from the support 200 is congruent or substantially congruent with the height Z of the fixing element 1. The longitudinal direction X, the height Z and the width Y of the fixing element 1 therefore become respectively the longitudinal direction, height and width of the lighting device according to the invention. It also follows that the planes of symmetry P1 and P3 previously defined are congruent or substantially congruent.

In this assembled position of the lighting device according to the invention illustrated on FIG. 3, the OLED diode 100 is blocked relative to the receiving part 2 in various ways and directions:

- the engagement of the side edges 230*a*, 230*b* of the slot 230 in the engagement grooves 3*a*, 3*b* of the fixing element 1 achieves a blocking of the fixing element 1 in the receiving part 2 in both ways of the height direction Z of the lighting device according to the invention. In fact, the lower face 101 of the OLED diode 100, resting against the outer face 23*a* of the upper wall 23 of the engagement portion, limits any relative movement of the OLED diode 100 and receiving part 2 in both ways of direction Z, corresponding to the height of the lighting device according to the invention.

also, the engagement of the side edges 230*a*, 230*b* of the slot 230 in the engagement grooves 3*a*, 3*b* of the fixing element 1, and the particular configuration of the head 11 of the fixing element 1 with the receiving cavity 220, achieve a blocking of the fixing element 1 relative to the receiving part 2 in both ways of direction Y, corresponding to the width of the lighting device according to the invention.

finally, the stop 12 achieved by the front end 10*d* of the upright 10 of the fixing element 1 resting against the end edge 230*c* of the slot 230, and/or the stopping of the blocking wall 12*a* of the stop 12 against the inlet wall 25 of the receiving part 2, achieve a blocking of the fixing element 1 with the support 200 in one way of the longitudinal direction X of the lighting device according to the invention. More precisely, this longitudinal blocking is achieved in the longitudinal direction of insertion of the fixing element 1 in the receiving cavity 220.

The OLED diode 100 is thus assembled with its support 200 in a simple and reproducible fashion.

FIGS. 4 and 5 illustrate a variant embodiment of the invention in which the OLED diode 100 with its support 200 is blocked, in particular in the previously defined longitudinal direction X, in both ways of this longitudinal direction. To achieve this, the lighting device in this embodiment comprises a pre-assembly hook 3.

With reference to FIG. 5, the pre-assembly hook 3 comprises a lug 30 arranged protruding, in the width direction Y of the lighting device according to the invention, from at least one of the side walls 24*a*, 24*b* of the engagement portion 22, here the side wall 24*a*. Advantageously, in the longitudinal direction X of the lighting device according to the invention, the lug 30 is arranged directly adjacent to the end edge of the slot provided in the engagement portion 22, i.e. closer to this end edge than to the inlet wall of the engagement portion 22.

With reference to FIGS. 4 and 5, the pre-assembly hook 3 also comprises a flexible tab 31 and a slit 32 provided on or in the head 11 of the fixing element 1. More precisely, the flexible tab 31 and the slit 32 are arranged in at least one of the side walls of the head 11. Advantageously, the flexible tab 31 protrudes relative to the side wall of the head 11. According to the variant but not exclusive embodiment illustrated more particularly in FIGS. 4 and 5, the flexible tab 31 has generally an L-shape, the short branch 31*b* of which is oriented in the longitudinal direction X of the lighting device according to the invention, and the long branch 31*a* of which is oriented in said transverse direction Y.

According to this variant embodiment, the slit 32 also has an L-shape substantially complementary to the L-shape of the flexible tab 31. More precisely, the slit 32 is formed by a cut-out in the head 11 around the branches of the L formed by the flexible tab 31.

According to the invention, the dimensions and/or respective positions of the lug 30 and flexible tab 31 are defined such that, during the longitudinal sliding movement on insertion of the fixing element 1 inside the receiving cavity 220, the lug 30 forms an obstacle to the progression of the fixing element 1. In other words, during the sliding movement, the long branch 31*a* of the flexible tab 31 comes to stop against the lug 30.

Because of the flexibility of the flexible tab 31 and the specific shape of the slit 32, the flexible tab 31 deforms under the effect of the stress applied longitudinally by the continued sliding movement of the fixing element 1 in the receiving cavity 220. The long branch 31 then escapes the lug 30 and passes this.

In the continuation of the sliding movement of the fixing element 1 in the receiving cavity 220 in the direction of the end wall 26, because of the natural elasticity of the material constituting the fixing element 1 and because of the slit 32, the flexible tab 31 resumes its initial position. A rear face of the long branch 31*a* of the flexible tab 31 then constitutes a longitudinal stop, preventing any sliding of the fixing element 1 towards the rear, i.e. in the direction of the inlet wall 25 of the receiving cavity 220.

By providing the pre-assembly hook 3 formed by the lug 30 and the flexible tab 31, the invention allows provision of an intermediate blocking of the OLED diode 100 in its support 200, i.e. prior to its final blocking.

FIG. 6 shows in perspective a lighting device according to the invention as just described, and part of its assembly for connection to an electrical power supply. The figure shows the OLED diode 100 and its support 200, together with the engagement portion 22 of the receiving part 2. The figure shows that on the front end of the fixing element 1, the support 200 comprises a protruding portion 4, part of which is configured to be positioned above the upper face 112 of the OLED diode 100, thus achieving a masking of the longitudinal end of the head 11.

This figure also depicts diagrammatically a connector 5 intended to ensure the electrical connection between the connecting element 130 previously described and an electrical power supply of the OLED diode 100, not shown on the figure. It is clear that the connector 5 is arranged opposite the receiving part 2 relative to the support 200. In other words, the connector 5 and the lighting device formed by the OLED diode 100 and the receiving part 2 are each arranged on one side of a wall forming the support 200.

FIG. 7 illustrates diagrammatically the various components of the lighting and/or signalling system of a motor vehicle comprising at least one lighting device according to the invention. With reference to this figure, such a system comprises a housing 6 and a transparent or translucent lens 7, which together delimit a receiving volume 600 of at least one lighting device according to the invention.

At least one OLED diode 100 received on a support 200 is placed in the receiving volume 600. According to the exemplary but not exclusive embodiment illustrated on FIG. 7, the support 200 comprises a plurality of receiving parts 2*a*, 2*b*, 2*c*, 2*d*, each intended to receive an OLED diode 100 (only one OLED diode 100 is shown on FIG. 7).

According to the particular arrangement illustrated on FIG. 7, the OLED diodes 100 are arranged side by side on the support 200 in the transverse direction Y previously defined. According to other exemplary embodiments, not shown here, the OLED diodes 100 and the corresponding receiving parts may for example be arranged staggered on the support 200, in particular in pairs.

The support 200 here forms a mask which separates the receiving volume 600 into a first sub-volume containing the OLED diodes and corresponding receiving parts, and the second sub-volume, also called the technical volume, containing the connectors such as the connector 5 illustrated on FIG. 6, via which the OLED diodes 100 are connected to an electrical power supply.

FIG. 8 illustrates in a rear view the lighting and/or signalling system as just described. The term "rear view" here means a view of the support 200 observed from said technical volume. According to the invention, a monobloc piece 8 is placed against a face 201 of the support 200 oriented on the side of this technical volume, such that it blocks at least two OLED diodes 100 in their respective receiving parts, in particular in said longitudinal direction X. Advantageously, the monobloc piece 8 blocks the assembly of OLED diodes 100 of the lighting and/or signalling system in a direction opposite the direction of insertion of the OLED diodes 100 in the receiving part concerned.

As FIG. 8 shows more precisely, the monobloc piece 8 is common to a plurality of lighting devices according to the invention.

The common piece 8, advantageously fixed on the support 200 for example via at least one screw (not shown on FIG. 8), allows complete fixing of the assembly of OLED diodes 100 in their receiving parts in a single step of fixing the monobloc piece 8.

The lighting devices according to the invention are electrically connected to a printed circuit board 35 via a common connection element 500, to which some or all of the connecting elements 130 previously described may be connected. The electrical connection of the printed circuit board 35 is then achieved by means of an assembly 9 for connection to an electrical power supply outside the lighting system.

The invention thus achieves a lighting device and a lighting and/or signalling system for a motor vehicle which uses at least one OLED-type diode, a lighting system and device in which the OLED diode or diodes are fixed in a simple and reproducible fashion on a support 200 or mask, which is simple and cheap to produce.

The invention described above is applied particularly advantageously but not exclusively to the lighting and/or signalling lamps situated at the rear of motor vehicles.

The invention described above is not however reduced to the means and configurations described and illustrated, and may also apply to all equivalent means or configurations and to any combination of such means. In particular, the forms described and illustrated here, in particular the form of the emitter part of the OLED diode, the substantially parallelepipedic forms of the elements of the fixing element 1 of the OLED diode 100 and of the receiving part 2, are not exclusive and any other shape may be considered insofar as it fulfils the functionalities described in the present document.

Furthermore, although the invention has been illustrated considering the particular example of an OLED source as a surface light source, it is evident that the invention applies to any type of surface light source as defined in the present text.

The invention claimed is:

1. Lighting device comprising at least one surface light source and a support for this, wherein the surface light source comprises a fixing element which extends in a longitudinal direction and has a T-shaped cross-section, and wherein the support comprises a receiving part for the fixing element, a cross-section through the receiving part having a shape complementary to the cross-section of the fixing element, the lighting device comprising at least one stop of the fixing element against the receiving part, the stop being arranged on an end face of the fixing element that intersects the longitudinal direction, wherein the fixing element comprises an upright capped with a head, the upright extending from a lower face of the surface light source, the upright and the head together with this lower face of the surface light source delimiting at least one engagement groove for the receiving part of the support.

2. Lighting device according to claim 1, wherein the stop comprises at least one blocking wall which extends substantially perpendicularly to the longitudinal direction of the fixing element.

3. Lighting device according to claim 1, wherein the receiving part comprises a guide portion for the fixing element and an engagement portion for the fixing element, the guide portion and the engagement portion being situated in the extension of each other in the main extension direction of the receiving part.

4. Lighting device according to claim 3, wherein the engagement portion extends protruding from the guide portion in an elevation direction perpendicular to the main extension direction.

5. Lighting device according to claim 3, wherein the engagement portion comprises an upper wall wherein a slot is arranged, the greatest dimension of which extends substantially in the main extension direction of the receiving part.

6. Lighting device according to claim 5, wherein the engagement portion comprises a first side wall, a second side wall and an inlet wall which, together with the upper wall, delimit a receiving cavity for the fixing element of the surface light source.

7. Lighting device according to t claim 6, wherein the inlet wall extends at the intersection of the guide portion and the engagement portion in the main extension direction, substantially perpendicularly to this main extension direction.

8. Lighting and/or signalling system for a motor vehicle comprising at least one lighting device according to claim 1.

9. Lighting and/or signalling system according to claim 8, wherein the lighting and/or signalling system comprises a plurality of lighting devices and a support common to the plurality of lighting devices.

10. Lighting and/or signalling system according to claim 9, wherein the lighting and/or signalling system comprises a monobloc piece configured to block at least two surface light sources on the support.

11. Lighting device according to claim 2, wherein the receiving part comprises a guide portion for the fixing element and an engagement portion for the fixing element, the guide portion and the engagement portion being situated in the extension of each other in the main extension direction of the receiving part.

12. Lighting device according to claim 2, wherein the receiving part comprises a guide portion for the fixing element and an engagement portion for the fixing element, the guide portion and the engagement portion being situated in the extension of each other in the main extension direction of the receiving part.

13. Lighting device according to claim 4, wherein the engagement portion comprises an upper wall wherein a slot is arranged, the greatest dimension of which extends substantially in the main extension direction of the receiving part.

14. Lighting device according to claim 5, wherein the lighting device comprises a pre-assembly hook for the surface light source on the support, formed by a lug protruding from a side wall of the engagement portion and a flexible tab arranged on the fixing element.

15. Lighting device according to claim 6, wherein the lighting device comprises a pre-assembly hook for the surface light source on the support, formed by a lug protruding from a side wall of the engagement portion and a flexible tab arranged on the fixing element.

16. Lighting device according to claim 7, wherein the lighting device comprises a pre-assembly hook for the surface light source on the support, formed by a lug protruding from a side wall of the engagement portion and a flexible tab arranged on the fixing element.

17. Lighting and/or signalling system for a motor vehicle comprising at least one lighting device according to claim 1.

18. Lighting device comprising at least one surface light source and a support for this, wherein the surface light source comprises a fixing element which extends in a longitudinal direction and has a T-shaped cross-section, wherein the support comprises a receiving part for the fixing element, a cross-section through the receiving part having a shape complementary to the cross-section of the fixing element, the lighting device comprising at least one stop of the fixing element against the receiving part, the stop being arranged on an end face in the extension of the fixing element that intersects the longitudinal direction, wherein the receiving part comprises a guide portion for the fixing element and an engagement portion for the fixing element, the guide portion and the engagement portion being situated in the extension of each other in the main extension direction of the receiving part, and wherein the lighting device comprises a pre-assembly hook for the surface light source on the support, formed by a lug protruding from a side wall of the engagement portion and a flexible tab arranged on the fixing element.

19. Lighting device comprising at least one surface light source and a support for this, wherein the surface light source comprises a fixing element which extends in a longitudinal direction and has a T-shaped cross-section, wherein the support comprises a receiving part for the fixing element, a cross-section through the receiving part having a shape complementary to the cross-section of the fixing element, the lighting device comprising at least one stop of the fixing element against the receiving part, the stop being arranged on an end face in the extension of the fixing element that intersects the longitudinal direction, wherein the receiving part comprises a guide portion for the fixing element and an engagement portion for the fixing element, the guide portion and the engagement portion being situated in the extension of each other in the main extension direction of the receiving part, wherein the engagement portion extends protruding from the guide portion in an elevation direction perpendicular to the main extension direction, and wherein the lighting device comprises a pre-assembly hook for the surface light source on the support, formed by a lug protruding from a side wall of the engagement portion and a flexible tab arranged on the fixing element.

* * * * *